(12) United States Patent
Lin et al.

(10) Patent No.: US 11,532,701 B2
(45) Date of Patent: Dec. 20, 2022

(54) SEMICONDUCTOR ISOLATION STRUCTURE AND METHOD FOR MAKING THE SEMICONDUCTOR ISOLATION STRUCTURE

(71) Applicant: TAIWAN SEMICONDUCTOR MANUFACTURING COMPANY, LTD., Hsinchu (TW)

(72) Inventors: Hsin-Fu Lin, Hsinchu (TW); Tsung-Hao Yeh, Hsinchu (TW); Chien-Hung Liu, Hsinchu (TW); Shiang-Hung Huang, Hsinchu (TW); Chih-Wei Hung, Hsinchu (TW); Tung-Yang Lin, Hsinchu (TW); Ruey-Hsin Liu, Hsinchu (TW); Chih-Chang Cheng, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 7 days.

(21) Appl. No.: 17/199,152

(22) Filed: Mar. 11, 2021

(65) Prior Publication Data
US 2022/0293723 A1 Sep. 15, 2022

(51) Int. Cl.
*H01L 29/06* (2006.01)
*H01L 21/762* (2006.01)
(Continued)

(52) U.S. Cl.
CPC .... *H01L 29/0619* (2013.01); *H01L 21/76283* (2013.01); *H01L 27/1203* (2013.01);
(Continued)

(58) Field of Classification Search
CPC .......... H01L 29/0619; H01L 21/76283; H01L 27/1203; H01L 29/1087;
(Continued)

(56) References Cited

U.S. PATENT DOCUMENTS

| 2015/0270333 | A1* | 9/2015 | Yang | ................. H01L 21/76283 438/151 |
| 2015/0348870 | A1* | 12/2015 | Feilchenfeld | ........... H01L 21/84 438/424 |
| 2017/0125584 | A1* | 5/2017 | Zhang | ................... H01L 29/063 |

FOREIGN PATENT DOCUMENTS

CN 111354677 A * 6/2020

* cited by examiner

*Primary Examiner* — Wasiul Haider
(74) *Attorney, Agent, or Firm* — Birch, Stewart, Kolasch & Birch, LLP

(57) ABSTRACT

A semiconductor isolation structure includes a handle layer, a buried insulation layer, a semiconductor layer, a deep trench isolation structure, and a heavy doping region. The buried insulation layer is disposed on the handle layer. The semiconductor layer is disposed on the buried insulation layer and has a doping type. The semiconductor layer has a functional area in which doped regions of a semiconductor device are to be formed. The deep trench isolation structure penetrates the semiconductor layer and the buried insulation layer, and surrounds the functional area. The heavy doping region is formed in the semiconductor layer, is disposed between the functional area and the deep trench isolation structure, and is surrounded by the deep trench isolation structure. The heavy doping region has the doping type. A doping concentration of the heavy doping region is higher than that of the semiconductor layer.

20 Claims, 11 Drawing Sheets

(51) Int. Cl.
  *H01L 29/10*   (2006.01)
  *H01L 27/12*   (2006.01)
  H01L 29/41   (2006.01)
  H01L 29/40   (2006.01)

(52) U.S. Cl.
  CPC ........ *H01L 29/1087* (2013.01); *H01L 29/401* (2013.01); *H01L 29/41* (2013.01)

(58) Field of Classification Search
  CPC .............................. H01L 29/7816–7826; H01L 29/66681–66704; H01L 29/7823; H01L 21/823481
  See application file for complete search history.

SEMICONDUCTOR ISOLATION STRUCTURE AND METHOD FOR MAKING THE SEMICONDUCTOR ISOLATION STRUCTURE

BACKGROUND

Power management integrated circuits (PMICs) are solid-state electrical devices that are used to control the flow of the electrical energy and have been widely used in various fields such as mobile phones, portable media players, automotive electronics and so forth. Semiconductor IC chips play an important role in PMICs. The miniaturization and technological growth of semiconductor IC chips lead to enhanced electrical performance of PMICs. However, the semiconductor IC chips still have some electrical issues (e.g., handling wafer bias effect) to be solved. These electrical issues may degrade the electrical performance of PMICs. Thus, the IC industry pays much attention on these electrical issues of semiconductor IC chips.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
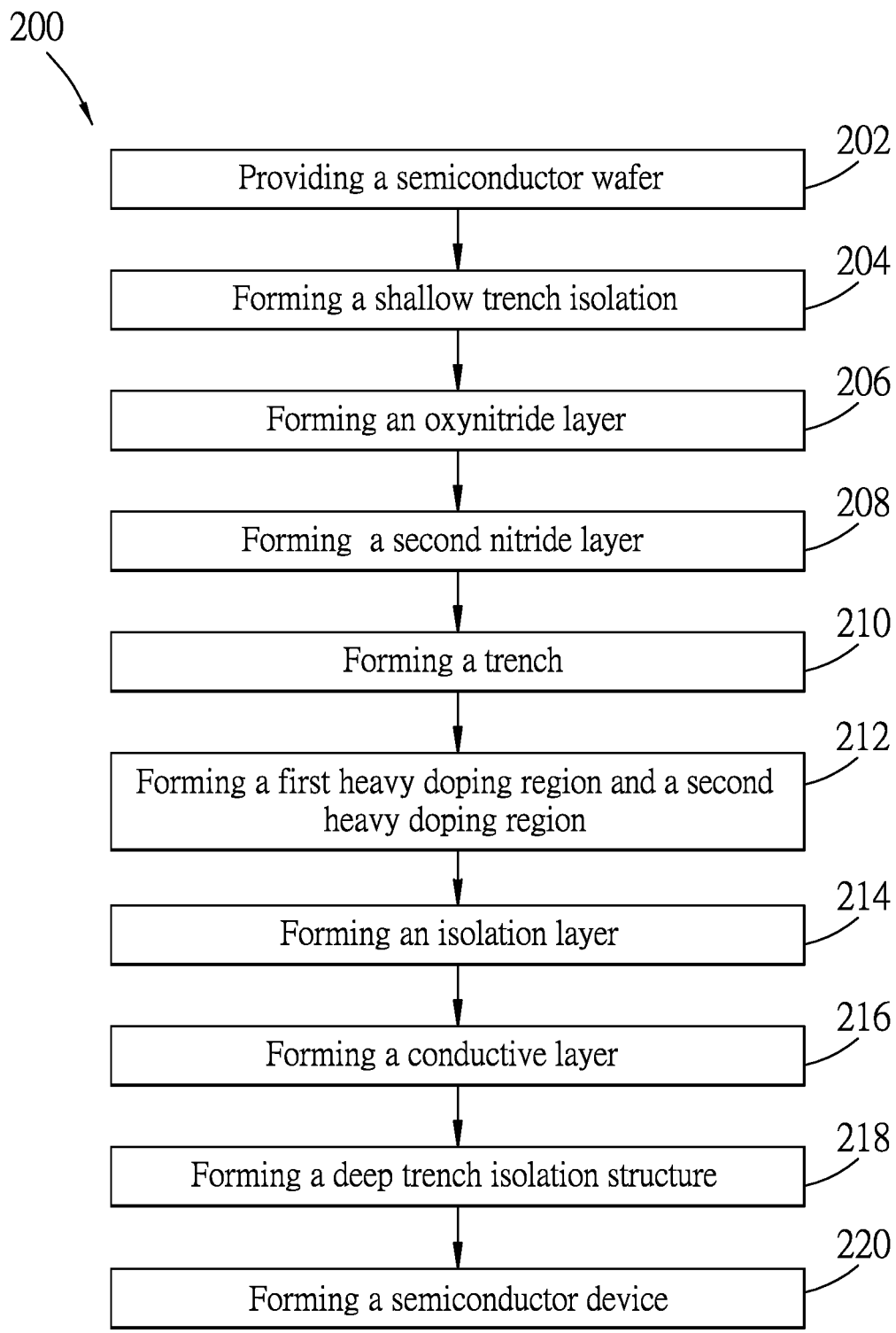
FIG. 1 illustrates a process flow for making a semiconductor isolation structure in accordance with some embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or in other orientations) and the spatially relative descriptors used herein may likewise be interpreted accordingly.

FIGS. 2 to 10 illustrate schematic views of intermediate steps in the formation of a semiconductor isolation structure in accordance with some embodiments. The corresponding processes are also reflected in the flow chart 200 shown in FIG. 1.

Figure 2:
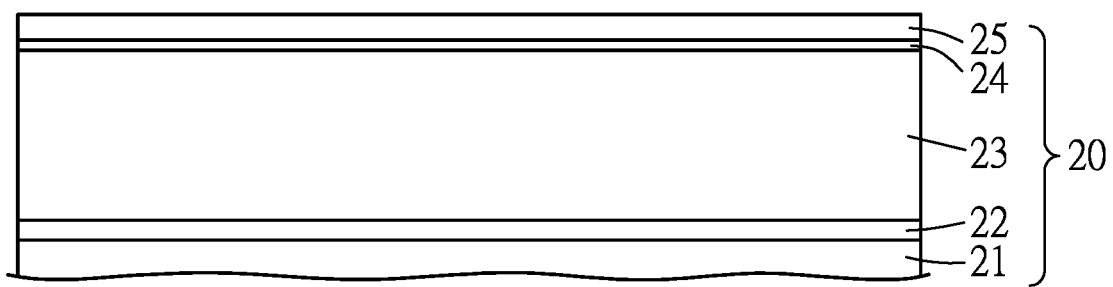
FIGS. 2 to 10 illustrate schematic views of steps in the formation of a semiconductor isolation structure in accordance with some embodiments.

Referring to FIG. 2, a semiconductor wafer 20 is provided. This process is illustrated as process 202 in the flow chart 200 shown in FIG. 1. In some embodiments, the semiconductor wafer 20 includes a handle layer 21, a buried insulation layer 22, a semiconductor layer 23, an oxide layer 24, and a first nitride layer 25. The handle layer 21 may be a semiconductor substrate, e.g., an elemental semiconductor or a compound semiconductor. The elemental semiconductor may be composed of single species of atoms, such as silicon (Si) and germanium (Ge) in column 14 of the periodic table, or other suitable materials. The compound semiconductor may be composed of two or more elements, such as silicon carbide (SiC), gallium arsenide (GaAs), gallium phosphide (GaP), indium phosphide (InP), indium arsenide (InAs), indium antimonide (InSb), silicon germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), gallium indium arsenide phosphide (GaInAsP) or the like. In some embodiments, the handle layer 21 may include a multilayer compound semiconductor wafer. Alternatively, the handle layer 21 may include a suitable non-semiconductor material, such as a glass, fused quartz, or calcium fluoride. In some embodiments, the handle layer 21 may be doped with a suitable p-type dopant, such as boron (B), aluminum (Al), gallium (Ga) or the like, or may alternatively be doped with a suitable n-type dopant, such as phosphorous (P), antimony (Sb), arsenic (As) or the like. In some embodiments, the buried insulation layer 22 is formed over the handle layer 21 by a suitable deposition technique, such as chemical vapor deposition (CVD) or the like. In some embodiments, the buried insulation layer 22 has a thickness ranging from about 0.2 μm to about 5 μm, but other range values are also within the scope of the disclosure. In some embodiments, the buried insulation layer 22 is made of oxide, such as silicon oxide or the like. In some embodiments, the semiconductor layer 23 is formed over the buried insulation layer 22 opposite to the handle layer 21 by a suitable deposition technique, such as CVD or the like. The semiconductor layer 23 may be doped with a suitable p-type dopant, such as B, Al, Ga or the like, or may alternatively be doped with a suitable n-type dopant, such as P, Sb, As or the like. In some embodiments, the semiconductor layer 23 has a first doping type and has a doping concentration ranging from about $1 \times 10^{15}/cm^3$ to about $3 \times 10^{15}/cm^3$, but other concentration ranges are also within the scope of the disclosure. In some embodiments, the oxide layer 24 may be optionally formed over the semiconductor layer 23 opposite to the buried insulation layer 22 by a suitable technique, such as CVD or the like. In some embodiments, the oxide layer 24 may be formed by thermally oxidizing the semiconductor layer 23 in an oxygen-containing atmosphere. In some embodiments, the first nitride layer 25 may be optionally formed over the oxide layer 24 opposite to the semiconductor layer 23 by a suitable deposition technique, such as CVD or the like.

Figure 3:
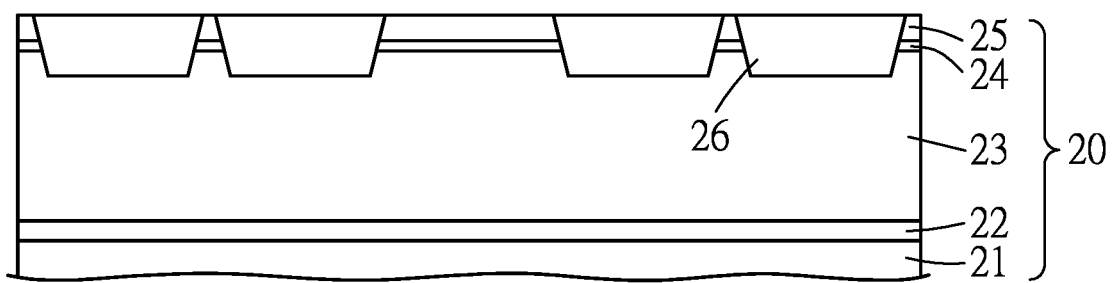

FIG. 3 illustrates that, after the provision of the semiconductor wafer 20, a shallow trench isolation (STI) 26 is formed into the semiconductor layer 23, the oxide layer 24, and the first nitride layer 25. This process is illustrated as process 204 in the flow chart 200 shown in FIG. 1. In some embodiments, the semiconductor layer 23, the oxide layer 24, and the first nitride layer 25 are etched by a suitable etching technique such as acid treatment (using, e.g., phosphoric acid ($H_3PO$), hydrofluoric acid (HF), or a combination thereof), dry etching or a combination thereof. The process of forming the STI 26 may involve etching the semiconductor layer 23, the oxide layer 24, and the first nitride layer 25 to form a shallow trench (not shown) and then filling the shallow trench with a suitable insulating material, such as oxide, nitride, oxynitride or the like. In some embodiments, the filled shallow trench is formed with a multi-layered structure (not shown). The filled shallow trench may optionally include a liner layer (not shown). In some embodiments, the liner layer may include a suitable material, such as oxide or the like. In some embodiments, the semiconductor wafer 20 only includes the handle layer 21, the buried insulation layer 22, and the semiconductor layer 23, and the STI 26 is formed in the semiconductor layer 23.

Figure 4:
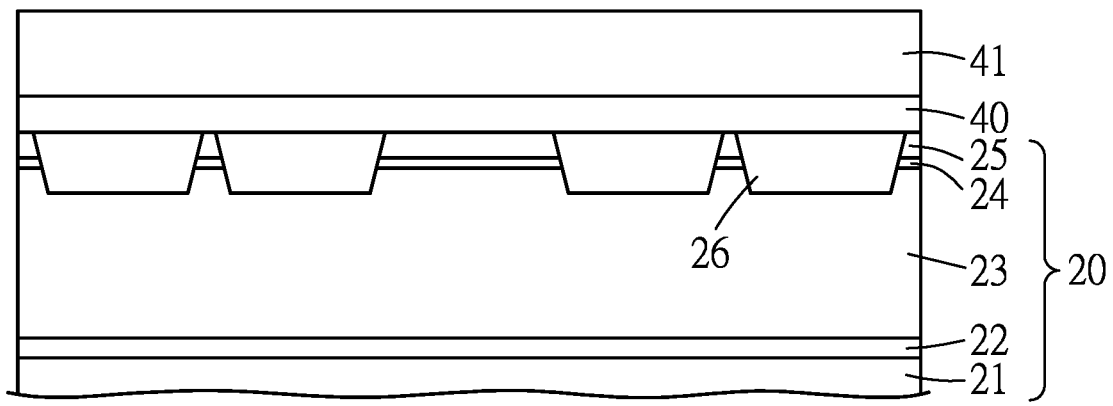

FIG. 4 illustrates that, after the formation of the STI 26, an oxynitride layer 40 is formed on the first nitride layer 25 opposite to the oxide layer 24. This process is illustrated as process 206 in the flow chart 200 shown in FIG. 1. In some embodiments, the oxynitride layer 40 may be formed by a suitable deposition technique, such as CVD or the like.

FIG. 4 also illustrates that, after the formation of the oxynitride layer 40, a second nitride layer 41 is formed on the oxynitride layer 40 opposite to the first nitride layer 25. This process is illustrated as process 208 in the flow chart 200 shown in FIG. 1. In some embodiments, the second nitride layer 41 may be formed by a suitable deposition technique, such as CVD or the like.

Figure 5:
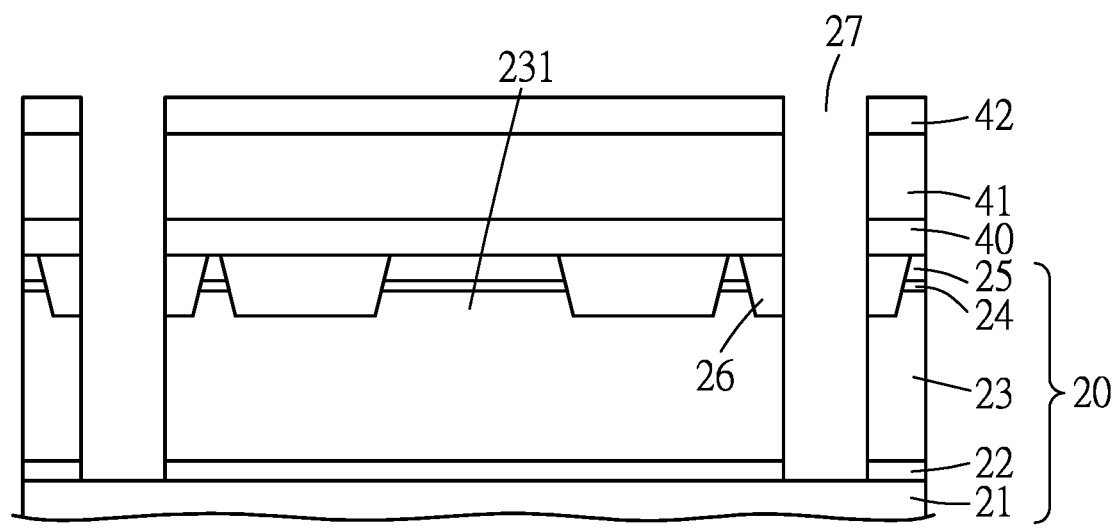

FIG. 5 illustrates that, after the formation of the second nitride layer 41, the second nitride layer 41, the oxynitride layer 40, the STI 26, the semiconductor layer 23, and the buried insulation layer 22 are etched to form a trench 27. This process is illustrated as process 210 in the flow chart 200 shown in FIG. 1. In some embodiments, the second nitride layer 41, the oxynitride layer 40, the STI 26, the semiconductor layer 23, and the buried insulation layer 22 may be etched using a mask layer 42 by a suitable etching technique, such as acid treatment (using, e.g., $H_3PO_4$, HF or the like), plasma dry etching (using, e.g., plasma containing $H_2$, $N_2$, $NH_3$, $O_2$, CxFx or the like), or a combination thereof, so as to form the trench 27. In this embodiment, the trench 27 penetrates the second nitride layer 41, the oxynitride layer 40, the STI 26, the semiconductor layer 23, and the buried insulation layer 22, and terminates at the handle layer 21. In some embodiments, the mask layer 42 may be a suitable photoresist layer or a suitable hardmask layer. In some embodiments, the semiconductor layer 23 has a functional area 231 in which doped regions of a semiconductor device (e.g., a semiconductor device 34 (see FIG. 11), which will be described in detail hereinafter) are to be formed.

Figure 6:
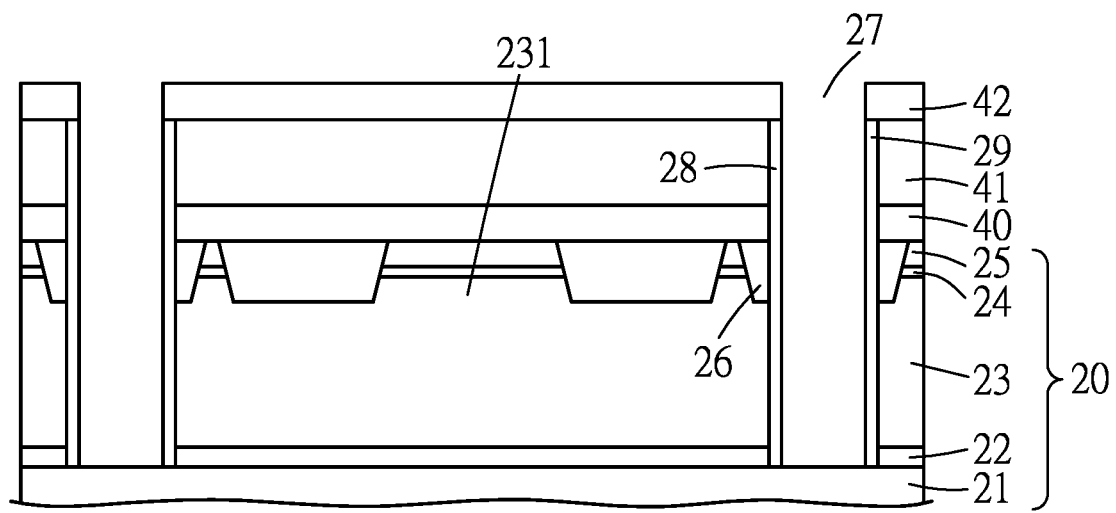

FIG. 6 illustrates that, after the formation of the trench 27, two opposite trench-defining side walls of the trench 27 are respectively doped to form a first heavy doping region 28 and a second heavy doping region 29. This process is illustrated as process 212 in the flow chart 200 shown in FIG. 1. The first heavy doping region 28 is formed between the functional area 231 of the semiconductor layer 23 and the trench 27. In some embodiments, the first heavy doping region 28 has the first doping type, and a doping concentration of the first heavy doping region 28 is higher than that of the semiconductor layer 23. In some embodiments, the doping concentration of the first heavy doping region 28 may range from about $1\times10^{16}/cm^3$ to about $1\times10^9/cm^3$. If the doping concentration of the first heavy doping region 28 is greater than the abovementioned range, properties of subsequently formed devices (e.g., the semiconductor device 34 (see FIG. 11)) may be adversely affected. If the doping concentration of the first heavy doping region 28 is lower than the abovementioned range, the first heavy doping region 28 may not achieve desirable electrical shielding effects. It should be noted that the doping concentration of the first heavy doping region 28 may be adjusted according to practical requirements. In some embodiments, a width of the first heavy doping region 28 may range from about 10 Å to about 1000 Å, but other range values are also within the scope of the disclosure. In some embodiments, the first heavy doping region 28 may be formed by using a suitable dopant, such as B, boron difluoride ($BF_2$), indium (In) or the like. In some embodiments, the second heavy doping region 29 has the first doping type, and a doping concentration of the second heavy doping region 29 is higher than that of the semiconductor layer 23. In some embodiments, the doping concentration of the second heavy doping region 29 may range from about $1\times10^{16}/cm^3$ to about $1\times10^9/cm^3$, but other concentration ranges are also within the scope of the disclosure. In some embodiments, a width of the second heavy doping region 29 may range from about 10 Å to about 1000 Å, but other range values are also within the scope of the disclosure. In some embodiments, the second heavy doping region 29 may be formed by using a suitable dopant, such as B, $BF_2$, In or the like. In some embodiments, the first heavy doping region 28 and the second heavy doping region 29 may be formed by using the same dopant; in other embodiments, the first heavy doping region 28 and the second heavy doping region 29 may be formed by using different dopants. In some embodiments, the first heavy doping region 28 and the second heavy doping region 29 may be formed by a suitable technique, such as ion implantation or the like, and furnace thermal treatment may be applied for purposes, such as dopant diffusion, repair of damaged crystal structure or the like. In some embodiments, the semiconductor isolation structure may only include the first heavy doping region 28. After the doping step, the mask layer 42 may be removed by a suitable technique, such as dry etching, wet etching, chemical mechanical polish (CMP) or the like. In some embodiments, the mask layer 42 may be removed prior to the doping step, and the first heavy doping region 28 and the second heavy doping region 29 may be formed by using the oxynitride layer 40 and the second nitride layer 41 as a mask for the doping process.

Figure 7:
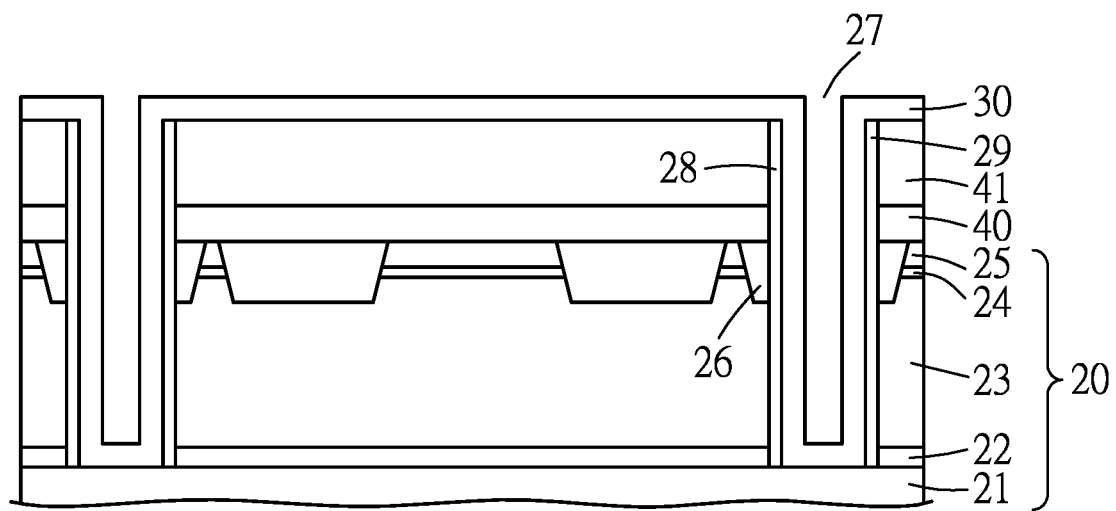

FIG. 7 illustrates that, after the formation of the first heavy doping region 28 and the second heavy doping region 29 and the removal of the mask layer 42 (see FIG. 6), an isolation layer 30 is conformally formed on a top surface of the second nitride layer 41, the two opposite trench-defining side walls and a trench-defining bottom wall that cooperates with the two opposite trench-defining side walls to define the trench 27. The isolation layer 30 may be made of a suitable material, such as silicon oxide, silicon oxynitride or the like.

The isolation layer 30 may be formed using a suitable deposition technique, such as CVD or the like.

Figure 8:
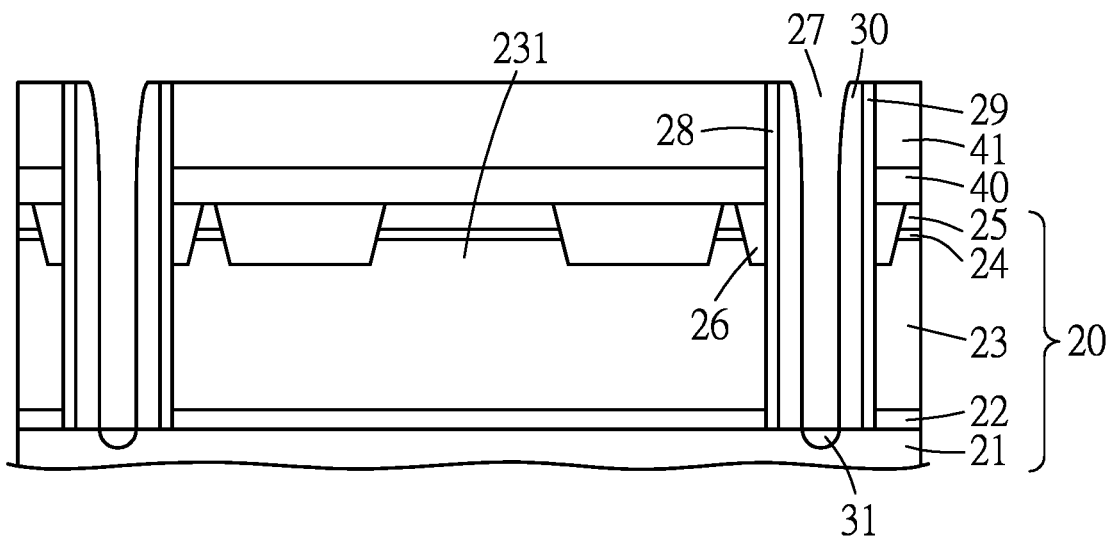

FIG. 8 illustrates that, after the formation of the isolation layer 30, a portion of the isolation layer 30 on the top surface of the second nitride layer 41 and the trench-defining bottom wall of the trench 27 are removed by a suitable etching technique, such as anisotropic plasma dry etching (using, e.g., plasma containing $H_2$, $N_2$, $NH_3$, $O_2$, CxFx or the like). The deposition and partial removal of the isolation layer 30 may be collectively illustrated as process 214 in the flow chart 200 shown in FIG. 1. In some embodiments, after this step, a high doping region 31 may be formed in the handle layer 21. In some embodiments, the high doping region 31 is formed by a suitable technique such as ion implantation or the like. In some embodiments, the high doping region 31 may be formed by using a suitable p-type dopant, such as B, Al, Ga or the like, or may alternatively be formed by using a suitable n-type dopant, such as P, Sb, As or the like. In some embodiments, a doping concentration of the high doping region 31 is greater than about $1\times10^{20}/cm^3$, but other concentration ranges are also within the scope of the disclosure.

Figure 9:
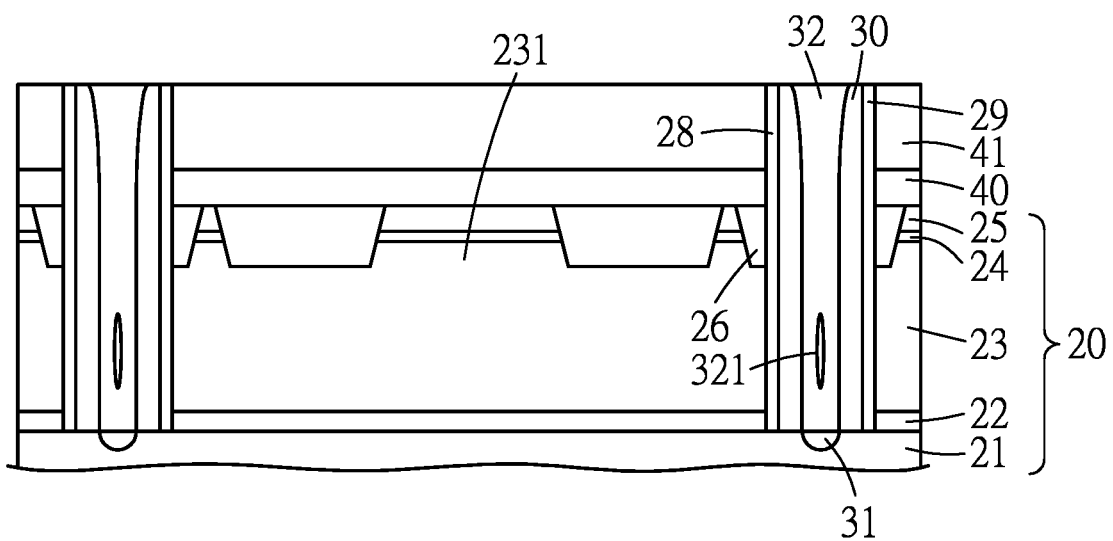

FIG. 9 illustrates that, after the formation of the isolation layer 30, a conductive layer 32 is formed on a top surface of the second nitride layer 41 and in the trench 27 (see FIG. 8) followed by removing the conductive layer 32 on the top surface of the second nitride layer 41. This process is illustrated as process 216 in the flow chart 200 shown in FIG. 1. In the trench 27, the conductive layer 32 is disposed in the isolation layer 30 and is connected to the handle layer 21. In some embodiments, the conductive layer 32 is made of a suitable material, such as polysilicon, metal (e.g., tungsten (W), Al or the like), or metal compound (e.g., titanium nitride (TiN), titanium silicide (TiSi) or the like). In some embodiments, the conductive layer 32 is formed by a suitable deposition technique, such as CVD, physical vapor deposition (PVD), electroplating (ECP) or the like. In the formation of the conductive layer 32 that fills the trench 27, a void 321 may be formed in the conductive layer 32. The conductive layer 32 on the top surface of the second nitride layer 41 may be removed by a suitable technique, such as CMP, chemical wet etching, dry etching or the like. In some embodiments, when the conductive layer 32 is made of polysilicon, the conductive layer 32 and the high doping region 31 may have an identical doping type. In this embodiment, the high doping region 31 may enhance electrical connection between the conductive layer 32 and the handle layer 21.

Figure 10:
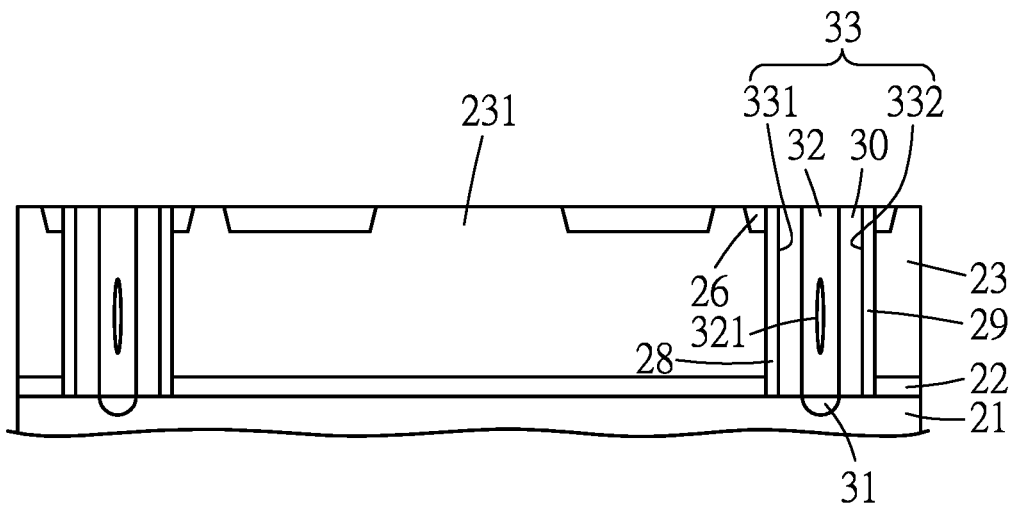

FIG. 10 illustrates that, after the removal of the conductive layer 32 on the top surface of the second nitride layer 41, the second nitride layer 41, the oxynitride layer 40, the first nitride layer 25, the oxide layer 24 (see FIG. 9), a portion of the isolation layer 30, a portion of the conductive layer 32, and a portion of the STI 26 are removed, so as to form a deep trench isolation (DTI) structure 33. This process is illustrated as process 218 in the flow chart 200 shown in FIG. 1. In some embodiments, the second nitride layer 41, the oxynitride layer 40, the first nitride layer 25, and the oxide layer 24 may be removed by a suitable technique, such as acid treatment (using, e.g., $H_3PO_4$, HF, or a combination thereof) or the like. In some embodiments, a portion of the isolation layer 30, a portion of the conductive layer 32, and a portion of the STI 26 may be removed by a suitable technique, such as CMP or the like. In some embodiments, the second nitride layer 41, the oxynitride layer 40, the first nitride layer 25, the oxide layer 24, a portion of the isolation layer 30, a portion of the conductive layer 32 and a portion of the STI 26 may be removed by the same technique, such as CMP or the like, so as to form the DTI structure 33. In some embodiments, the DTI structure 33 may penetrate the STI 26, the semiconductor layer 23 and the buried insulation layer 22, and terminate at the handle layer 21. In some embodiments, the DTI structure 33 has a first side wall 331 that faces the functional area 231 of the semiconductor layer 23, and a second side wall 332 that is opposite to the first side wall 331 and that faces away from the functional area 231 of the semiconductor layer 23. In some embodiments, the first heavy doping region 28 extends along the first side wall 331 of the DTI structure 33. In some embodiments, the first heavy doping region 28 is in contact with and completely covers the first side wall 331 of the DTI structure 33. In some embodiments, the second heavy doping region 29 extends along the second side wall 332 of the DTI structure 33. In some embodiments, the second heavy doping region 29 is in contact with and completely covers the second side wall 332 of the DTI structure 33.

Figure 11:
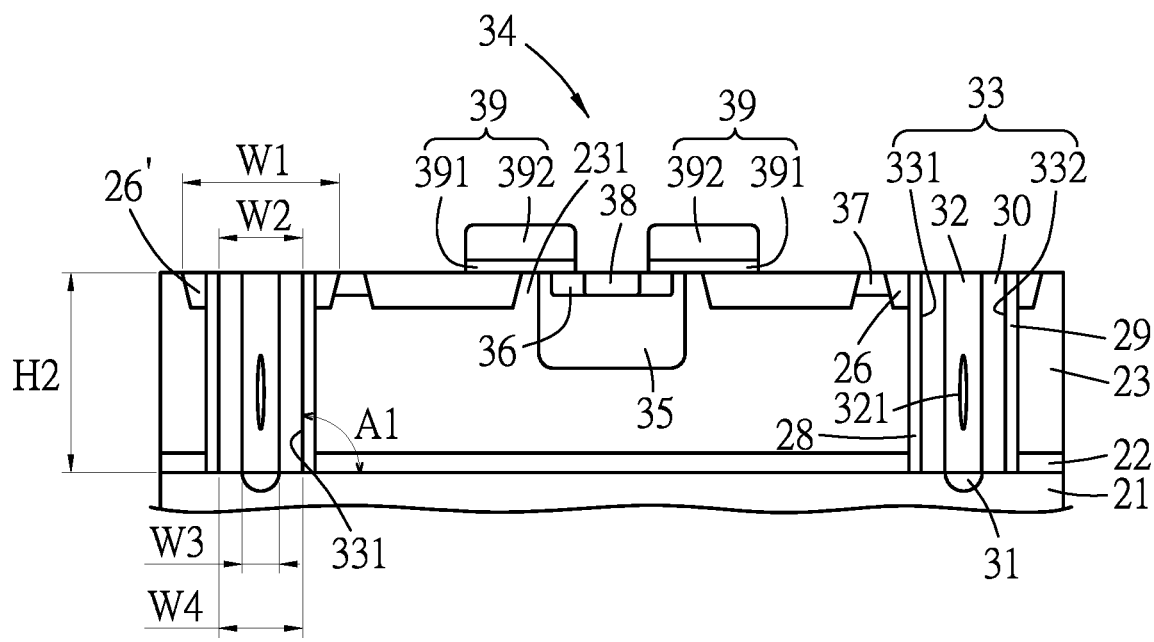
FIG. 11 illustrates a schematic view of a high voltage power device in accordance with some embodiments.

FIG. 11 illustrates that, after the formation of the DTI structure 33, the semiconductor device 34 is formed in the functional area 231 of the semiconductor layer 23 (see FIG. 3). This process is illustrated as process 220 in the flow chart 200 shown in FIG. 1. In some embodiments, the semiconductor device 34 includes a well region 35, a source region 36, a drain region 37, and a bulk region 38, and these regions are the doped regions of the semiconductor device 34. The well region 35 may be formed in the functional area 231 of the semiconductor layer 23 and surrounded by the STI 26. In some embodiments, the well region 35 may have a second doping type such as n-doping type, or p-doping type. In some embodiments, the n-doping type or p-doping type well region may be formed by a plurality of processing steps. For example, a photoresist is formed over the semiconductor layer 23 while exposing a portion of the semiconductor layer 23 for forming the well region 35, and an n-type dopant (e.g., P, Sb, As or the like) is then introduced into the exposed portion by a suitable technique such as ion implantation, so as to form the n-doping type well region. The source region 36 may be formed in the well region 35 and may have the first doping type. The drain region 37 may be formed in the functional area 231 outside of the well region 35 and may have the first doping type. The source region 36 and the drain region 37 may be formed by using a suitable dopant such as an n-type dopant (e.g., P, Sb, As or the like), or alternatively a p-type dopant (e.g., B, Al, Ga or the like). The bulk region 38 may be formed in the well region 35 and may have the second doping type. In some embodiments, a doping type of the bulk region 38 is different from a doping type of the source region 36 and the drain region 37. For example, if the source region 36 and the drain region 37 are doped with an n-type dopant, the bulk region 38 will be doped with a p-type dopant, and vice versa. In some embodiments, the drain region 37 is isolated from the source region 36 and the bulk region 38 by the STI 26.

In some embodiments, the semiconductor device 34 further includes a gate structure 39 formed over the semiconductor layer 23. In some embodiments, the gate structure 39 includes a gate dielectric layer 391 that is formed over the semiconductor layer 23, and a gate electrode layer 392 that is formed on the gate dielectric layer 391 opposite to the semiconductor layer 23. In some embodiments, the gate dielectric layer 391 is formed to have a suitable thickness over the semiconductor layer 23 by a suitable techniques, which may be CVD, PVD, atomic layer deposition (ALD), high density plasma CVD (HDPCVD), metal organic CVD (MOCVD), remote plasma CVD (RPCVD), plasma enhanced CVD (PECVD), plating, other suitable methods, or combinations thereof. The gate dielectric layer 391 may be made of, for example but not limited to, silicon oxide, silicon oxynitride, silicon nitride, spin-on glass (SOG), fluorinated silica glass (FSG), carbon doped silicon oxide, other suitable dielectric materials, or combinations thereof. In some embodiments, the gate dielectric layer 391 may include a high-k dielectric material, such as $HfO_2$, HfSiO, HfSiON, HfTaO, HfTiO, HfZrO, other suitable high-k dielectric materials, or combinations thereof. In some embodiments, the gate dielectric layer 391 may be formed as a multi-layered structure. The gate electrode layer 392 is used to be coupled to metal interconnects. The gate electrode layer 392 may include polysilicon, or may alternatively include metal (e.g., Al, Cu, Ti, Ta or the like), metal compound (e.g., TiN, TaN, NiSi, CoSi or the like), other suitable conductive materials, or combinations thereof. In some embodiments, the gate electrode layer 392 may be formed to have a suitable thickness over the gate dielectric layer 391 by a suitable technique, which may be CVD, PVD, ALD, HDPCVD, MOCVD, RPCVD, PECVD, plating, other suitable methods, or combinations thereof. In some embodiments, the gate electrode layer 392 may be formed as a multi-layered structure. The source region 36 and the drain region 37 may be formed before or after the formation of the gate structure 39. In some embodiments, the semiconductor device 34 may include two gate structures 39 (see FIG. 11), which may be electrically interconnected.

It should be noted that, the dimension of the STI 26 may be determined according to practical applications. Referring to FIG. 11, a portion 26' of the STI 26 that is located adjacent to the drain region 37 and that is penetrated by the DTI structure 33 is shown to have a maximum width (W1). FIG. 11 also shows that the DTI structure 33 has a maximum width (W2) and a height (H2). The height (H2) of the DTI structure 33 is determined by practical requirements. In some embodiments, the maximum width (W2) of the DTI structure 33 is not greater than the maximum width (W1) of the portion 26' of the STI 26. In some embodiments, the maximum width (W2) of the DTI structure 33 may range from about 1 µm to about 30 µm, but other range values are also within the scope of the disclosure. In some embodiments, the first side wall 331 of the DTI structure 33 forms an included angle (A1) with the handle wafer 21, the included angle (A1) may range from about 80 degrees to about 90 degrees, but other range values are also within the scope of the disclosure. In some embodiments, a maximum width (W3) of the conductive layer 32 as shown in FIG. 11 may not be greater than about 40% of the maximum width (W4) of the isolation layer 30 (i.e., the maximum width (W2) of the DTI structure 33 as shown in FIG. 11), but other width relationship between the conductive layer 32 and the isolation layer 30 are also within the scope of the disclosure.

Figure 12:
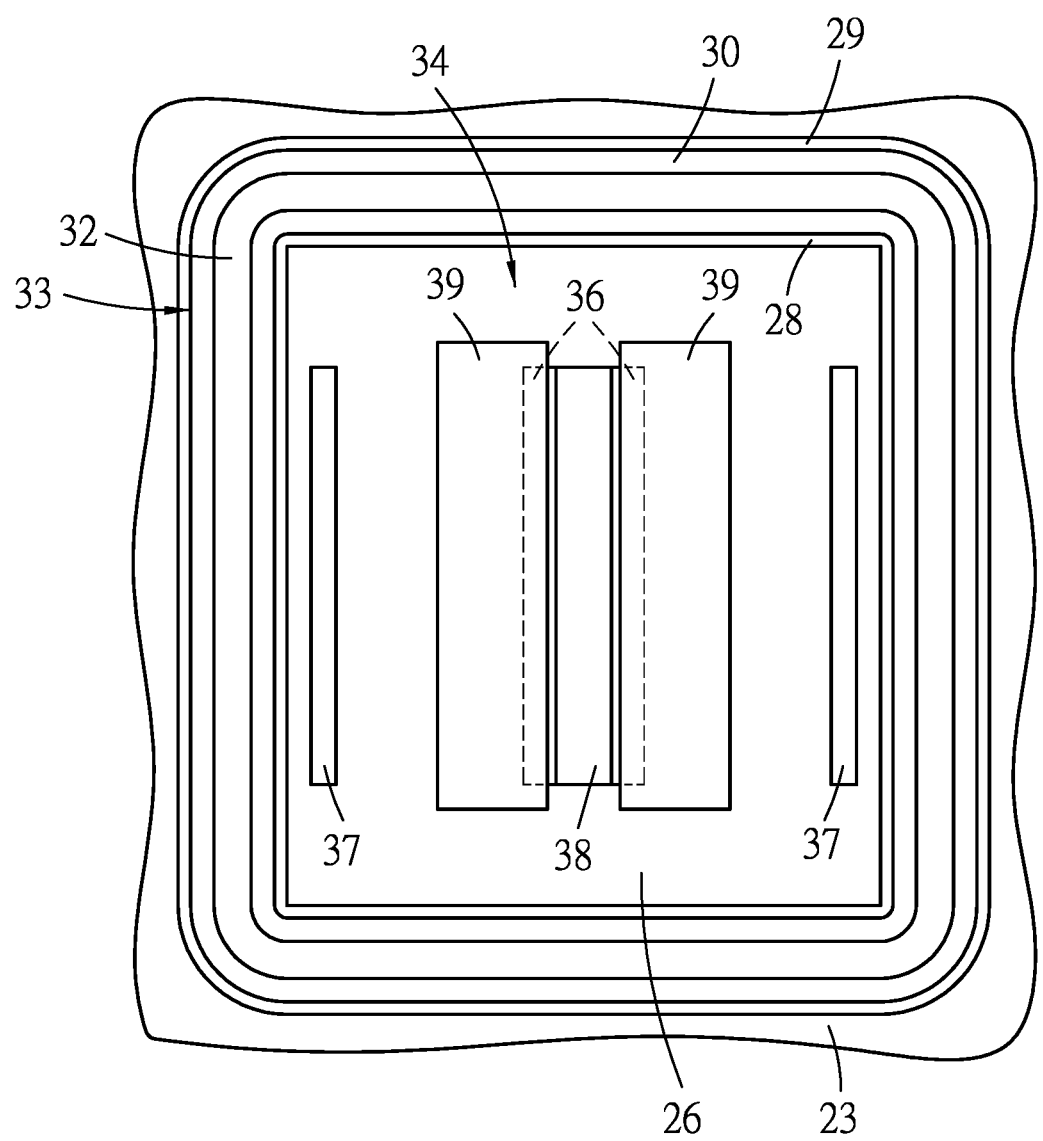
FIG. 12 illustrates a top view of a high voltage power device in accordance with some embodiments.

FIG. 12 illustrates a high voltage power device that includes the semiconductor isolation structure and the semiconductor device 34. In such high voltage power device, the DTI structure 33 includes the isolation layer 30, and the conductive layer 32 that is surrounded by the isolation layer 30. The first heavy doping region 28 is surrounded by the DTI structure 33, and the DTI structure 33 is surrounded by the second heavy doping region 29. The doping concentration of each of the first heavy doping region 28 and the second heavy doping region 29 may range from about $1\times10^{16}/cm^3$ to about $1\times10^{19}/cm^3$, and other range values are also within the scope of the disclosure.

Figure 13:
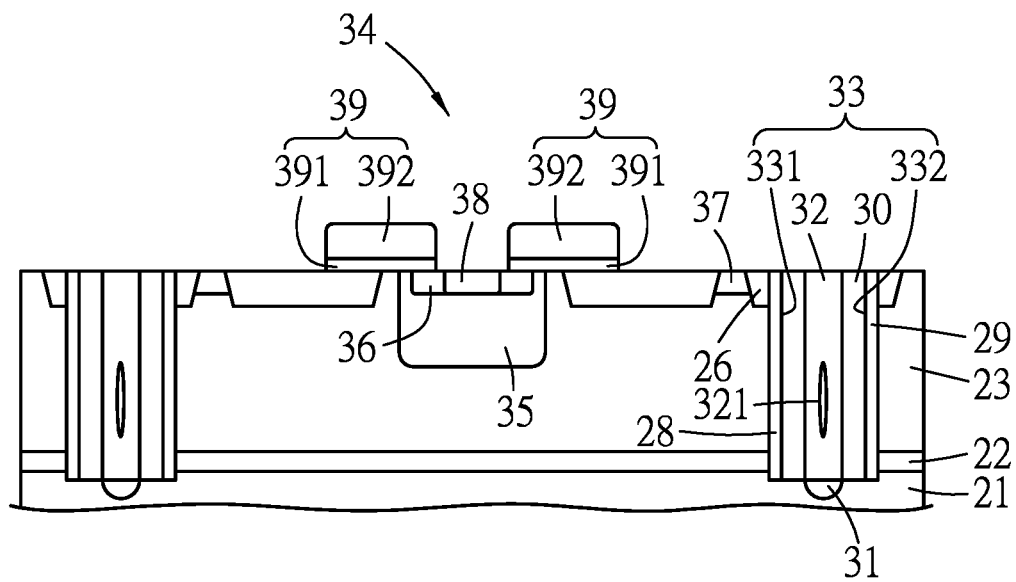
FIGS. 13 to 15 illustrate various examples of a semiconductor isolation structure in accordance with some embodiments.

Referring to FIG. 13, in accordance with some embodiments, the process of forming the trench 27 (see FIG. 5) involves forming the trench 27 which extends into the handle layer 21, followed by performing processes 212 to 218 in the flow chart 200 shown in FIG. 1, such that the first heavy doping region 28, the second heavy doping region 29, and a portion of the DTI structure 33 can be formed in the handle layer 21.

Figure 14:
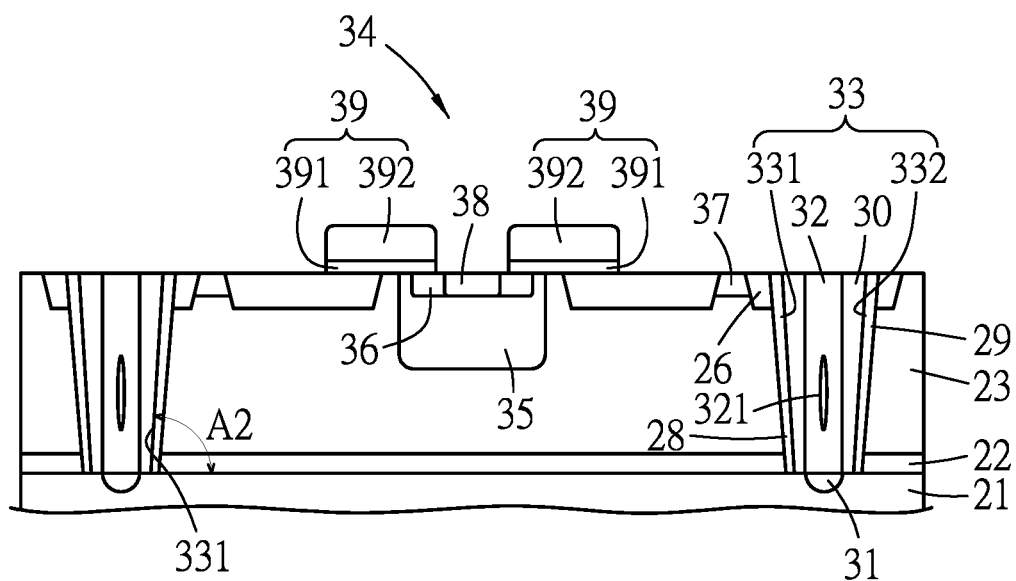

In some embodiments, a cross-section of the trench 27 is formed in an inverted trapezoid shape in process 210 in the flow chart 200 shown in FIG. 1. Therefore, the subsequently formed DTI structure 33 also exhibits an inverted trapezoid cross-section, as shown in FIG. 14. In this embodiment, the first side wall 331 of the DTI structure 33 forms an included angle (A2) with the handle wafer 21; the included angle (A2) may not be greater than about 90 degrees.

Figure 15:
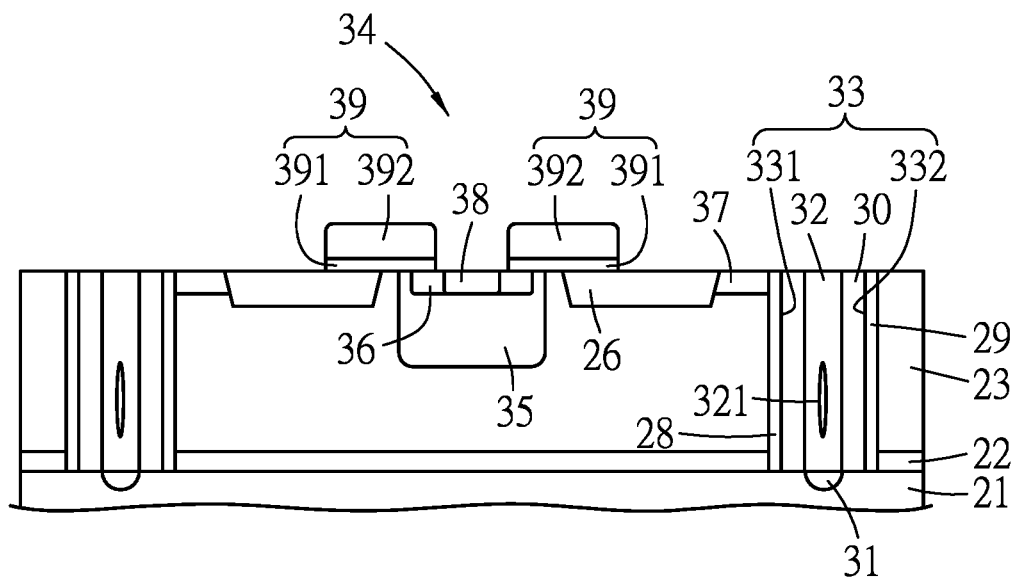

Referring to FIG. 15, in accordance with some embodiments, the DTI structure 33 may be formed to penetrate the semiconductor layer 23 and the buried insulation layer 22 and may be disposed outside of the STI 26.

Figure 16:
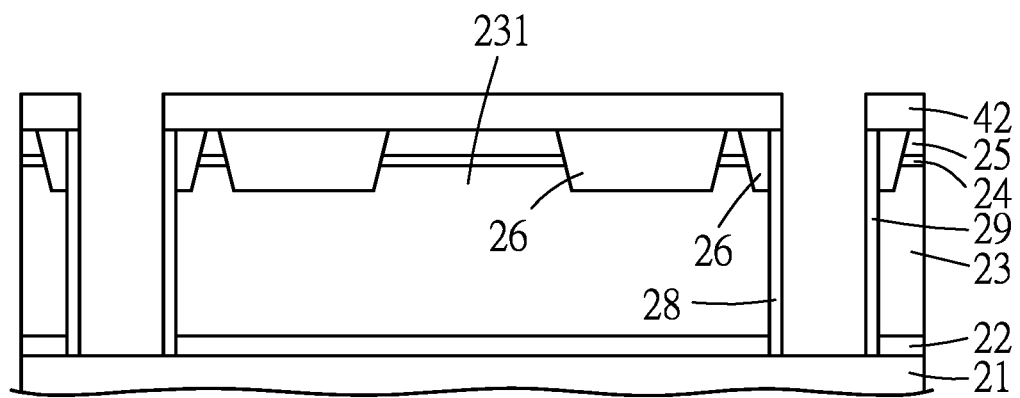
FIGS. 16 to 19 illustrate schematic views of steps in the formation of a semiconductor isolation structure in accordance with some embodiments.

Referring to FIG. 16, in accordance with some embodiments, after the formation of the STI 26 (i.e., after performing process 204 in the flow chart 200 shown in FIG. 1), the mask layer 42 may be directly formed on the first nitride layer 25 and the STI 26. Afterwards, the STI 26, the semiconductor layer 23, and the buried insulation layer 22 are etched to form the trench 27. That is, process 210 in the flow chart 200 shown in FIG. 1 is performed. In such embodiments, the oxynitride layer 40 and the second nitride layer 41 (see FIG. 4) may not be formed on the STI 26 (i.e., processes 206 and 208 in the flow chart 200 shown in FIG. 1 are not performed).

Figure 17:
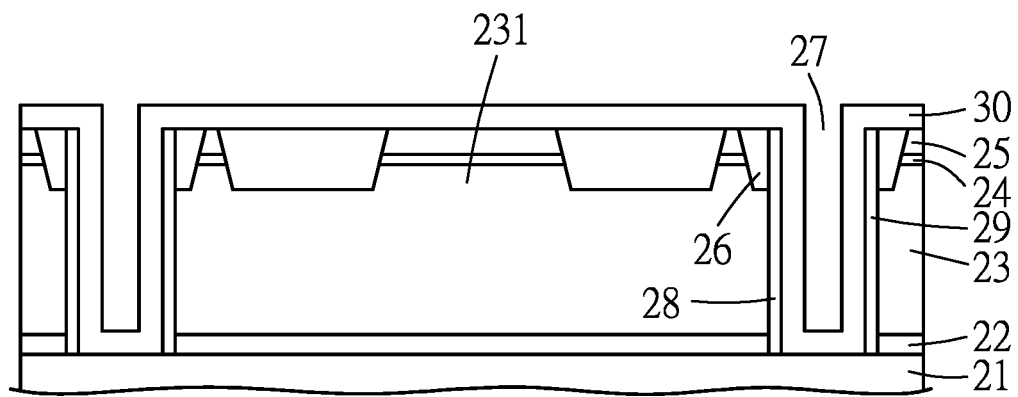

FIG. 17 illustrates that, after the formation of the trench 27, the mask layer 42 is removed followed by forming the isolation layer 30 on the top surface of the first nitride layer 25, the two opposite trench-defining side walls and the trench-defining bottom wall that cooperatives with the two opposite trench-defining side walls to define the trench 27. That is, process 214 in the flow chart 200 as shown in FIG. 1 is performed. In some embodiments, the mask layer 42 is removed by a suitable technique, such as stripping, CMP or the like. In some embodiments, the isolation layer 30 may be formed using a suitable deposition technique, such as CVD or the like.

Figure 18:
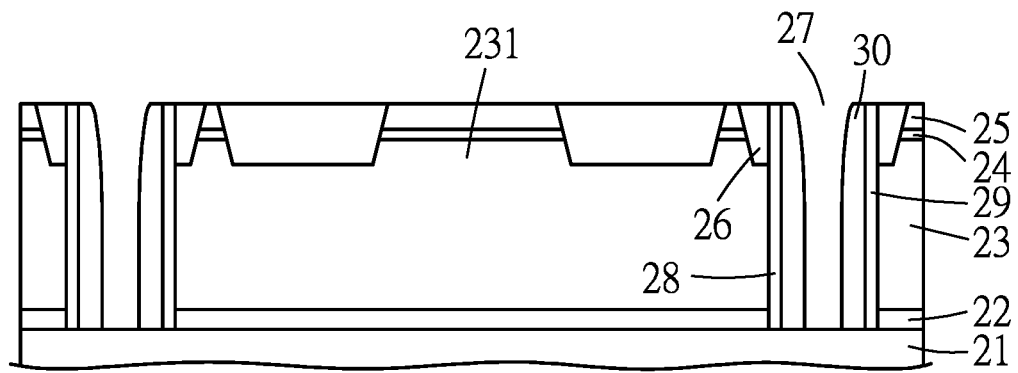

FIG. 18 illustrates that, after the formation of the isolation layer 30, the isolation layer 30 on the top surface of the first nitride layer 25 and the trench-defining bottom wall of the trench 27 is removed by a suitable etching technique, such as plasma dry etching (e.g., plasma containing $H_2$, $N_2$, $NH_3$, $O_2$, CxFx or the like). Afterwards, process 216 as shown in FIG. 1 can be performed.

Figure 19:
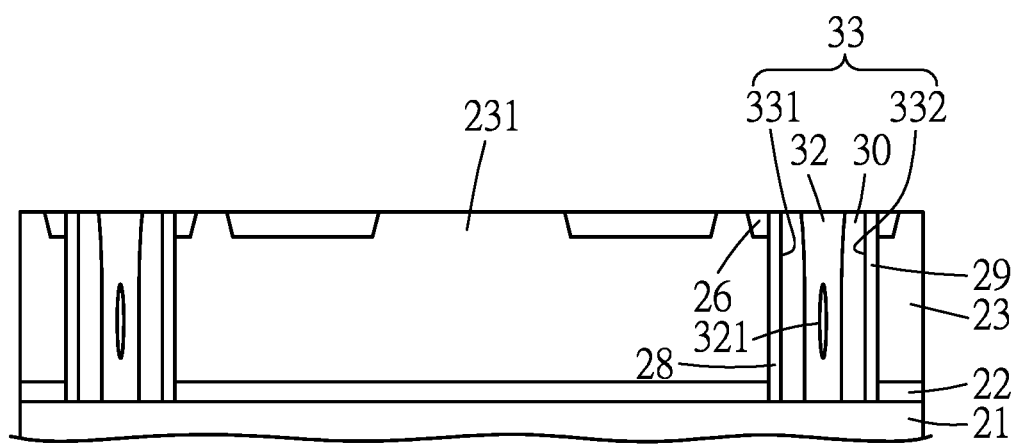

FIG. 19 illustrates that, the conductive layer 32 on the top surface of the first nitride layer 25 (see FIG. 18), the first nitride layer 25 and the oxide layer 24 are removed followed by removing a portion of the isolation layer 30, a portion of the conductive layer 32, and a portion of the STI 26, so as to form the DTI structure 33. That is, process 218 in the flow chart 200 shown in FIG. 1 is performed. In some embodiments, the conductive layer 32 on the top surface of the first nitride layer 25 is removed by a suitable technique, such as CMP or the like. In some embodiments, the first nitride layer 25 and the oxide layer 24 are removed by a suitable etching technique, such as an acid treatment (using, e.g., $H_3PO_4$, HF, or a combination thereof) or the like. In some embodiments, a portion of the isolation layer 30, a portion of the conductive layer 32, and a portion of the STI 26 are removed by a suitable technique, such as CMP or the like. In some embodiments, in this step, the conductive layer 32 on the top surface of the first nitride layer 25, the first nitride layer 25, the oxide layer 24, a portion of the isolation layer 30, a portion of the conductive layer 32 and a portion of the STI 26 may be removed by the same technique, such as CMP or the like, so as to form the DTI structure 33. Afterwards, process 220 in the flow chart 200 shown in FIG. 1 may be performed to form the semiconductor device 34 (see FIG. 11).

The embodiments of the present disclosure have some advantageous features. By having the first heavy doping region that is formed in the semiconductor layer, that is disposed between the functional area of the semiconductor layer and the DTI structure, when a high voltage (e.g., greater than about 40V) is applied to the conductive layer, the first heavy doping region may serve as an anti-depletion region near the DTI structure, thereby suppressing breakdowns (which may also be referred to as hot spots) from happening near the DTI structure or making the hot spots move away from the DTI structure in the semiconductor layer. In other words, the first heavy doping region may provide an electrical shield for the high voltage power device, thereby reducing the leakage current thereof, improving the breakdown voltage (BV) and the off-state current ($I_{off}$) thereof, and enhancing immunity thereof to the potential bias effect. In some embodiments, the BV of the high voltage power device with the first heavy doping region may be increased up to about twice (e.g., from about 50V to about 90V) that of a high voltage power device without any heavy doping region. In some embodiments, the leakage current of the high voltage power device may be significantly reduced by more than about 3 orders of magnitude (e.g., from about 1 mA to about 1 μA) as compared with a high voltage power device without any heavy doping region.

In accordance with some embodiments, a semiconductor isolation structure includes a handle layer, a buried insulation layer, a semiconductor layer, a deep trench isolation structure, and a first heavy doping region. The buried insulation layer is disposed on the handle layer. The semiconductor layer is disposed on the buried insulation layer and has a first doping type. The semiconductor layer has a functional area in which doped regions of a semiconductor device are to be formed. The deep trench isolation structure penetrates the semiconductor layer and the buried insulation layer, and surrounds the functional area. The first heavy doping region is formed in the semiconductor layer, is disposed between the functional area and the deep trench isolation structure, and is surrounded by the deep trench isolation structure. The first heavy doping region has the first doping type. A doping concentration of the first heavy doping region is higher than that of the semiconductor layer.

In accordance with some embodiments, a semiconductor feature includes a handle layer, a buried insulation layer, a semiconductor layer, a semiconductor device, a deep trench isolation structure, and a first heavy doping region. The buried insulation layer is disposed on the handle layer. The semiconductor layer is disposed on the buried insulation layer and has a functional area. The semiconductor layer has a first doping type. The semiconductor device has a well region that has a second doping type and that is formed in the functional area, a source region that is formed in the well region and that has the first doping type, a bulk region that is formed in the well region and that has the second doping type, a drain region that is formed in the functional area outside of the well region and that has the first doping type, and a gate structure that is disposed over the well region and the source region. The drain region is isolated from the source region and the bulk region. The deep trench isolation structure is formed in the semiconductor layer and the buried insulation layer, and surrounds the functional area. The first heavy doping region is formed in the semiconductor layer, is disposed between the functional area and the deep trench isolation structure, and is surrounded by the deep trench isolation structure. The first heavy doping region has the first doping type. A doping concentration of the first heavy doping region is higher than that of the semiconductor layer.

In accordance with some embodiments, a method of making a semiconductor structure includes: forming a trench in a semiconductor wafer, the semiconductor wafer including a handle layer, a buried insulation layer disposed on the handle layer and a semiconductor layer disposed on the buried insulation layer, the semiconductor layer having a first doping type and a functional area in which doped regions of a semiconductor device are to be formed, the trench penetrating the semiconductor layer and the buried insulation layer, and surrounding the functional area; forming a first heavy doping region in the semiconductor layer, the first heavy doping region being formed between the functional area and the trench and being surrounded by the trench, the first heavy doping region having the first doping type, a doping concentration of the first heavy doping region being higher than that of the semiconductor layer; and forming a deep trench isolation structure in the trench.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor isolation structure comprising:
a handle layer;
a buried insulation layer that is disposed on the handle layer;
a semiconductor layer that is disposed on the buried insulation layer and that has a first doping type, the semiconductor layer having a functional area in which doped regions of a semiconductor device are to be formed;
a deep trench isolation structure that penetrates the semiconductor layer and the buried insulation layer, and that surrounds the functional area; and
a first heavy doping region that is formed in the semiconductor layer, that is disposed between the functional area and the deep trench isolation structure, and that is surrounded by the deep trench isolation structure, the first heavy doping region having the first doping type, a doping concentration of the first heavy doping region being higher than that of the semiconductor layer.

2. The semiconductor isolation structure as claimed in claim 1, wherein:
the deep trench isolation structure has a first side wall that faces the functional area; and
the first heavy doping region extends along the first side wall.

3. The semiconductor isolation structure as claimed in claim 2, wherein the first heavy doping region is in contact with and completely covers the first side wall.

4. The semiconductor isolation structure as claimed in claim 2, wherein the deep trench isolation structure further has a second side wall that is opposite to the first side wall and that faces away from the functional area, and the semiconductor isolation structure further includes a second heavy doping region that is formed in the semiconductor layer and that extends along the second side wall.

5. The semiconductor isolation structure as claimed in claim 1, wherein the doping concentration of the first heavy doping region ranges from about $10^{16}/cm^3$ to about $10^{19}/cm^3$.

6. The semiconductor isolation structure as claimed in claim 1, wherein a width of the first heavy doping region ranges from about 10 Å to about 1000 Å.

7. The semiconductor isolation structure as claimed in claim 1, further comprising a shallow trench isolation that is formed in the semiconductor layer, the deep trench isolation structure further penetrating the shallow trench isolation.

8. The semiconductor isolation structure as claimed in claim 1, wherein the deep trench isolation structure includes an isolation layer, and a conductive layer that is disposed in the isolation layer and that is connected to the handle layer.

9. The semiconductor isolation structure as claimed in claim 8, wherein a maximum width of the conductive layer is not greater than about 40% of a maximum width of the isolation layer.

10. A semiconductor feature comprising:
a handle layer;
a buried insulation layer that is disposed on the handle layer;
a semiconductor layer that is disposed on the buried insulation layer and that has a functional area, the semiconductor layer having a first doping type;
a semiconductor device having a well region that has a second doping type and that is formed in the functional area, a source region that is formed in the well region and that has the first doping type, a bulk region that is formed in the well region and that has the second doping type, a drain region that is formed in the functional area outside of the well region and that has the first doping type, and a gate structure that is disposed over the well region and the source region, the drain region being isolated from the source region and the bulk region;
a deep trench isolation structure that is formed in the semiconductor layer and the buried insulation layer, and that surrounds the functional area; and
a first heavy doping region that is formed in the semiconductor layer, that is disposed between the functional area and the deep trench isolation structure, and that is surrounded by the deep trench isolation structure, the first heavy doping region having the first doping type, a doping concentration of the first heavy doping region being higher than that of the semiconductor layer.

11. The semiconductor feature as claimed in claim 10, further comprising a second heavy doping region that is formed in the semiconductor layer opposite to the first heavy doping region, and that surrounds the deep trench isolation structure, the second heavy doping region having the first doping type, a doping concentration of the second heavy doping region being higher than that of the semiconductor layer.

12. The semiconductor feature as claimed in claim 10, wherein the doping concentration of the first heavy doping region ranges from about $10^{16}/cm^3$ to about $10^{19}/cm^3$.

13. The semiconductor feature as claimed in claim 10, wherein a width of the first heavy doping region ranges from about 10 Å to about 1000 Å.

14. The semiconductor feature as claimed in claim 10, wherein the deep trench isolation structure includes an isolation layer, and a conductive layer that is disposed in the isolation layer and that is connected to the handle layer.

15. A method of making a semiconductor structure, comprising:
forming a trench in a semiconductor wafer, the semiconductor wafer including a handle layer, a buried insulation layer disposed on the handle layer and a semiconductor layer disposed on the buried insulation layer, the semiconductor layer having a first doping type and a functional area in which doped regions of a semiconductor device are to be formed, the trench penetrating the semiconductor layer and the buried insulation layer, and surrounding the functional area;
forming a first heavy doping region in the semiconductor layer, the first heavy doping region being formed between the functional area and the trench and being surrounded by the trench, the first heavy doping region having the first doping type, a doping concentration of the first heavy doping region being higher than that of the semiconductor layer; and
forming a deep trench isolation structure in the trench.

16. The method as claimed in claim 15, wherein:
the functional area is surrounded by a shallow trench isolation formed in the semiconductor layer; and
in the formation of the trench, the trench penetrates the shallow trench isolation.

17. The method as claimed in claim 15, wherein, in the formation of the first heavy doping region, the doping concentration of the first heavy doping region ranges from about $10^{16}/cm^3$ to about $10^{19}/cm^3$.

18. The method as claimed in claim 15, further comprising forming a second heavy doping region in the semiconductor layer opposite to the first heavy doping region, the second heavy doping region surrounding the trench, a doping concentration of the second heavy doping region being higher than that of the semiconductor layer.

19. The method as claimed in claim 15, wherein the formation of the deep trench isolation structure includes forming an isolation layer in the trench, and forming a conductive layer in the trench such that the conductive layer is disposed in the isolation layer and is connected to the handle layer.

20. The method as claimed in claim 19, wherein, in the formation of the isolation layer, the isolation layer is conformally formed on a top surface of the semiconductor structure, two opposite trench-defining side walls and a trench-defining bottom wall that cooperates with the trench-defining side walls to define the trench, followed by removing a portion of the isolation layer on the top surface of the semiconductor structure and on the trench-defining bottom wall.

* * * * *